(12) United States Patent
Hasselbach et al.

(10) Patent No.: US 8,138,008 B1
(45) Date of Patent: Mar. 20, 2012

(54) FORMING AN OXIDE MEMS BEAM

(75) Inventors: Joseph P. Hasselbach, Burlington, VT (US); Karen L. Lestage, Fairfax, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/955,224

(22) Filed: Nov. 29, 2010

(51) Int. Cl.
*H01L 21/00* (2006.01)

(52) U.S. Cl. ......................................................... 438/52

(58) Field of Classification Search ...................... 438/52
See application file for complete search history.

(56) References Cited

U.S. PATENT DOCUMENTS

| | | | |
|---|---|---|---|
| 5,578,976 | A | 11/1996 | Yao |
| 6,069,540 | A | 5/2000 | Berenz et al. |
| 6,686,820 | B1 | 2/2004 | Ma et al. |
| 6,979,872 | B2 * | 12/2005 | Borwick et al. ............... 257/415 |
| 7,026,184 | B2 | 4/2006 | Xie et al. |
| 7,057,251 | B2 | 6/2006 | Reid |
| 7,202,101 | B2 | 4/2007 | Gabriel et al. |
| 2009/0134513 | A1 | 5/2009 | Qiu |

OTHER PUBLICATIONS

Hill et al., Performance and reliability of post-CMOS metal/oxide MEMS for RF application, Journal of Micromechanics and Microengineering, Jun. 13, 2003, pp. 131-138.
Min et al., "In situ measurement of residual stress in micromachined thin films using a specimen with composite-layered cantilevers", Journal of Micromechanics and Microengineering, Jan. 2000, pp. 314-321.
Qiu et al., "Effect of Sacrificial Layer Compliance on Thermal Stresses of Composite MEMS Beams", Proceedings of the 2009 4th IEEE International Conference on Nano/Micro Engineered and Molecular Systems, Jan. 5-8, 2009, pp. 1073-1078.

* cited by examiner

*Primary Examiner* — William D Coleman
(74) *Attorney, Agent, or Firm* — Richard M. Kotulak; Hoffman Warnick LLC

(57) ABSTRACT

Solutions for forming a semiconductor including an oxide MEMS beam are disclosed. In one embodiment, a method of forming a beam within a sealed cavity includes: depositing a lower insulator layer comprising one or more layers; depositing an upper insulator layer over the first insulator layer, the upper insulator layer comprising one or more layers, wherein a composite stress of the upper insulator layer is different than a composite stress of the lower insulator layer.

22 Claims, 24 Drawing Sheets

FORMING AN OXIDE MEMS BEAM

CROSS-REFERENCE TO RELATED APPLICATIONS

This application is related in some aspects to commonly owned and co-pending patent application number (to be provided), entitled "OXIDE MEMS BEAM", Ser. No. 12/955,220, filed Nov. 29, 2010, the entire contents of which are herein incorporated by reference.

BACKGROUND

1. Technical Field

The disclosure relates generally to micro electro-mechanical systems (MEMS), and more particularly, to methods of forming an oxide MEMS beam including a stress gradient.

2. Background Art

Micro Electro Mechanical Systems (MEMS) switches are fabricated such that there is a movable beam electrode which, when electrostatically actuated, makes contact to a second electrode. The second electrode is usually fixed to a surface under or over the movable beam electrode. The movable beam electrode, which can be a cantilever or bridge beam, is fabricated such that it is surrounded by a sacrificial material, such as silicon, oxide, or polymer which is subsequently removed to release the beam. MEMS switches are used, for example, for RF capacitors or contact switches, and range in thickness and length roughly from 0.1 m and 10 m to 10 m and 1000 m, respectively.

Other MEMS devices include resonators, acoustic wave devices, oscillators, motion detectors, pressure sensors, etc. which may have dielectric and semiconductor beams or beams formed of other materials. During wafer processing variation in film thickness or stress can induce undesirable MEMS beam bending. In addition, during operation, a MEMS beam bridge may be exposed to varying temperatures that causes the beam to bend up or down. This can affect the electrical properties of a wafer. Therefore, it is desirable to control the beam bending and to maintain a known beam stress. The stress of a thin film can be given in MPa and typical values for conductors, semiconductors, and dielectrics are normally in the range of −1000 MPa to 1000 Mpa and more typically in the range of −200 to 200 MPa. Negative stress means that the film is compressive; positive stress means that a film is tensile.

BRIEF SUMMARY

A first aspect of the disclosure provides a method of forming a beam within a sealed cavity, the method comprising: depositing a lower insulator layer comprising one or more layers; and depositing an upper insulator layer over the first insulator layer, the upper insulator layer comprising one or more layers, wherein a composite stress of the upper insulator layer is different than a composite stress of the lower insulator layer.

A second aspect of the disclosure provides a method of forming a beam within a sealed cavity, the method comprising: depositing a first stabilizing insulator layer; depositing an insulator layer above the first stabilizing insulator layer, the insulator layer including an unstable stress when exposed to ambient; and depositing a second stabilizing insulator layer above the insulator layer, wherein the first stabilizing insulator layer and the second stabilizing insulator layer include a stable stress when exposed to ambient.

A third aspect of the disclosure provides a method of forming a beam within a sealed cavity, the method comprising: forming a lower conductor layer comprising one or more metal layers; depositing an insulator layer above the lower conductor layer; and forming an upper conductor layer above the insulator layer, the upper conductor layer comprising one or more metal layers, wherein at least one of: a stress, a thickness, or a pattern factor of the upper conductor layer is different than a stress, a thickness, or a pattern factor of the lower conductor layer.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

As used herein, the term "deposition" or "depositing" may include any now known or later developed techniques appropriate for the material to be deposited including but are not limited to, for example: chemical vapor deposition (CVD), low-pressure CVD (LPCVD), plasma-enhanced CVD (PECVD), sub-atmosphere CVD (SACVD), atmospheric pressure CVD (APCVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, or evaporation. The figures shown herein are not drawn to scale and, in particular, many are drawn exaggerating the y axis or compressing the x axis. In one exemplary embodiment, the beam thickness, gap thickness, beam length, and beam width of the MEMS device described in the figures is 3 m, 3 m, 300 m, and 100 m.

Figure 1:
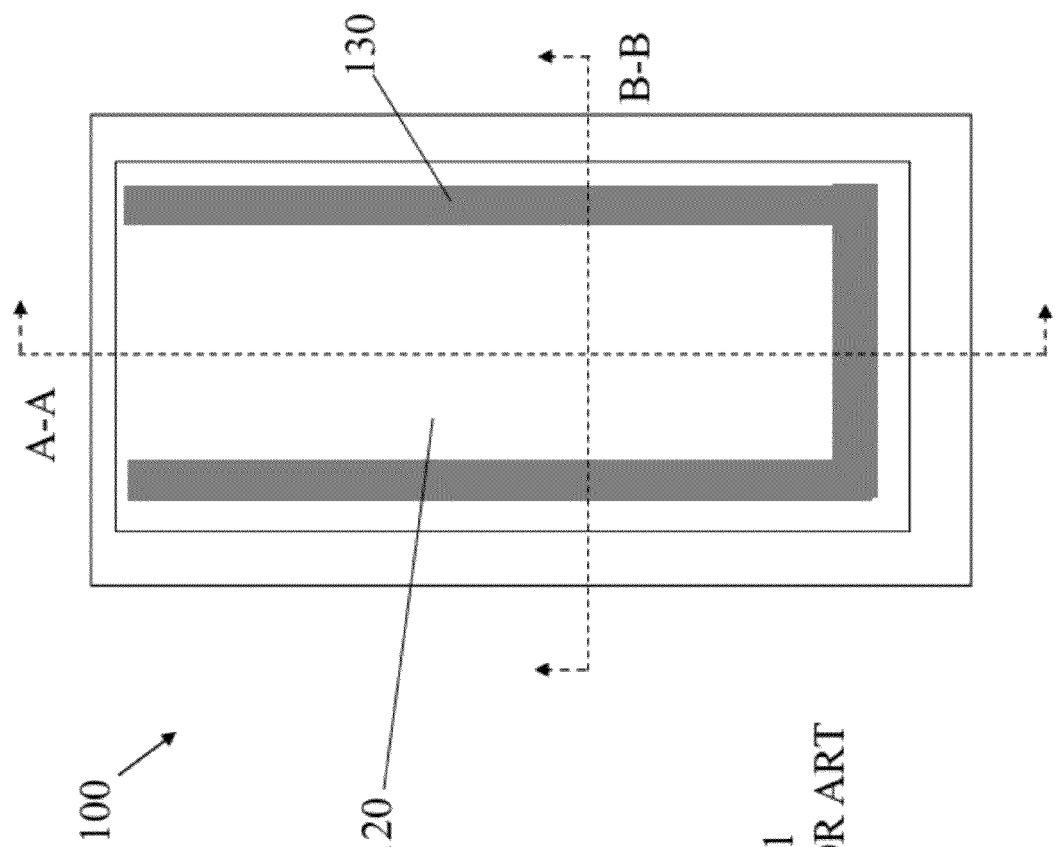
FIG. 1 shows a top view of a prior art semiconductor structure.

Turning now to the drawings, FIG. 1 shows a top view of a prior art semiconductor structure 100. As seen in FIG. 1, prior art semiconductor structure 100 may include a beam 120 within a sealed cavity 130. Turning now to FIGS. 2A and 2B, FIG. 2A shows a cross-sectional view of semiconductor structure 100 along plane A-A of FIG. 1 and FIG. 2B shows another cross-sectional view of semiconductor structure 100 along plane B-B of FIG. 1. As mentioned with FIG. 1, prior art semiconductor structure 100 may include beam 120 positioned within sealed cavity 130. Prior art semiconductor structure 100 may also include an electrode 107. However, electrode 107 is an optional electrode formed of, for example, a conductor, under beam 120 at the bottom of sealed cavity 130. During operation, beam 120 may be electrostatically actuated (i.e., by applying a voltage between beam 120 and electrode 107), to force beam 120 to bend and contact electrode 107. If a MEMS capacitor is being formed, then beam 120, electrode 107, or both, would be coated with a thin dielectric layer (not shown), such as silicon dioxide ($SiO_2$), so that, when they are in contact, a capacitor is formed. If both beam 120 and electrode 107 were left exposed (without a thin dielectric layer), when beam 120 and electrode 107 contacted, an ohmic contact would be formed. Electrode 107 may be connected to circuits or other devices (not shown), as known in the art to form a functional MEMS device.

As shown in FIGS. 2A and 2B, beam 120 of prior art semiconductor device 100 may include a lower conductor layer 140, an upper conductor layer 145, and an oxide layer 150. Oxide layer 150 may be positioned between lower conductor layer 140 and upper conductor layer 145. Oxide layer 150 may include a thickness that is greater than a thickness of each of lower conductor layer 140 and upper conductor layer 145. Other portions of prior art semiconductor device 100 shown in FIGS. 2A-2B include a substrate 105, a second oxide layer 155, a vent opening 158, a dielectric layer 170, and a sealing layer 180.

Since the coefficient of thermal expansion (CTE) of metals is higher compared to oxides, during operation, lower conductor layer 140 and upper conductor layer 145 cause the bending of beam 120, either up or down, depending on the metal thickness, stress, and pattern. However, because the thickness of oxide layer 150 is greater than the thicknesses of lower conductor layer 140 and upper conductor layer 145, beam 120 may not curve according to lower conductor layer 140 and upper conductor layer 145. That is, the bending of beam 120 may be reduced or controlled by a thicker oxide layer 150, rather than by lower conductor layer 140 and second upper conductor layer 145. However, control of MEMS bending is desired without increasing the thickness of oxide layer 150.

Figure 2:
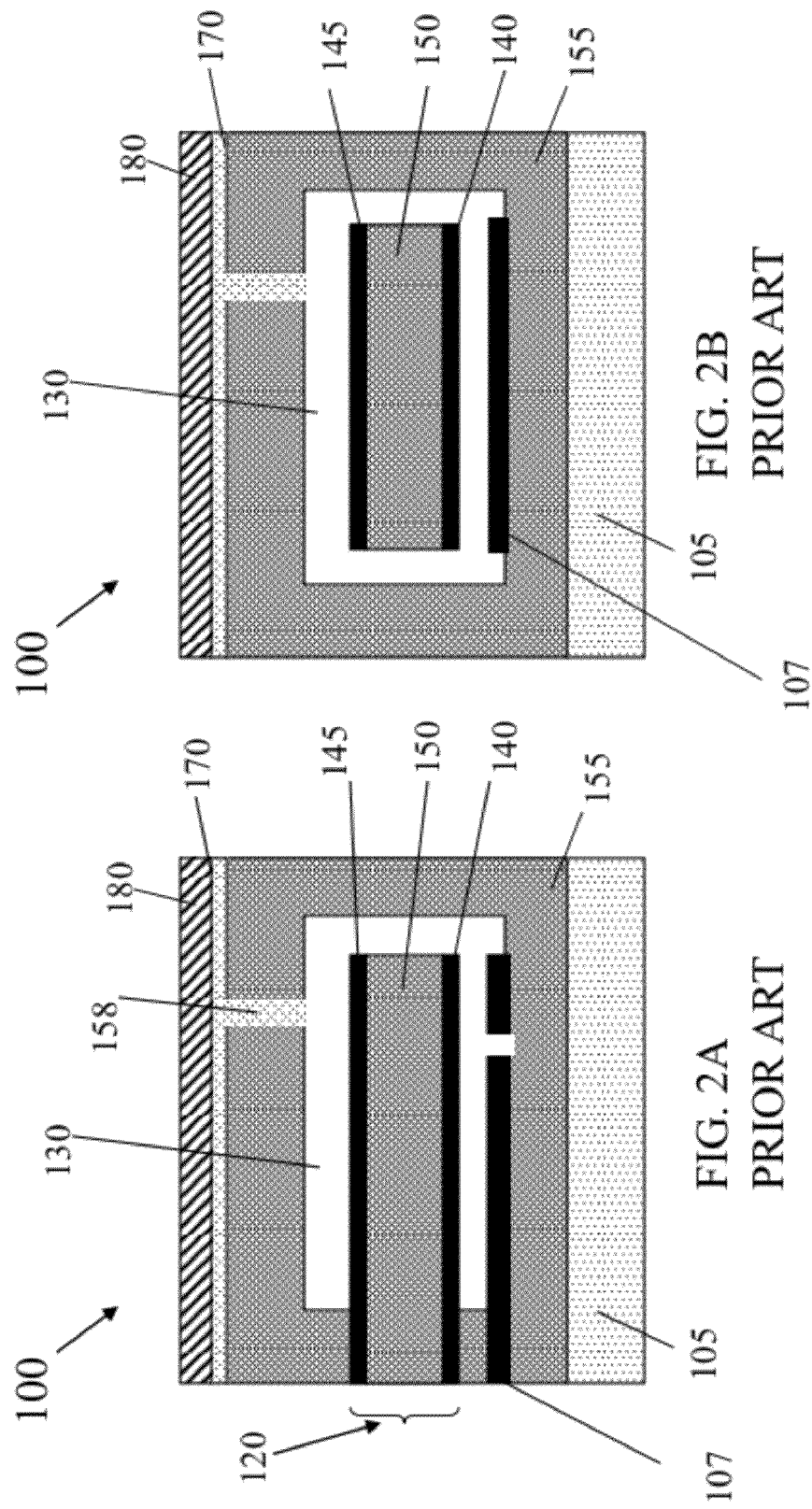
FIGS. 2A-2B show cross-sectional views of a prior art semiconductor structure.
Figure 3:
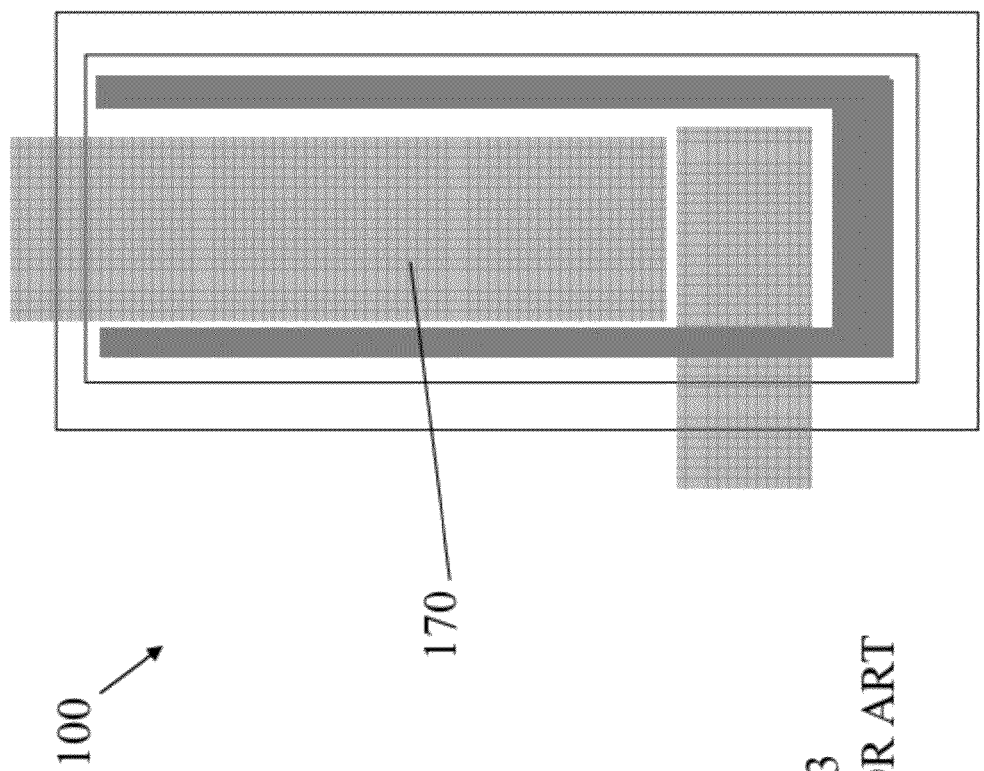
FIGS. 3-5 shows top views of a prior art semiconductor structure.
Figure 4:
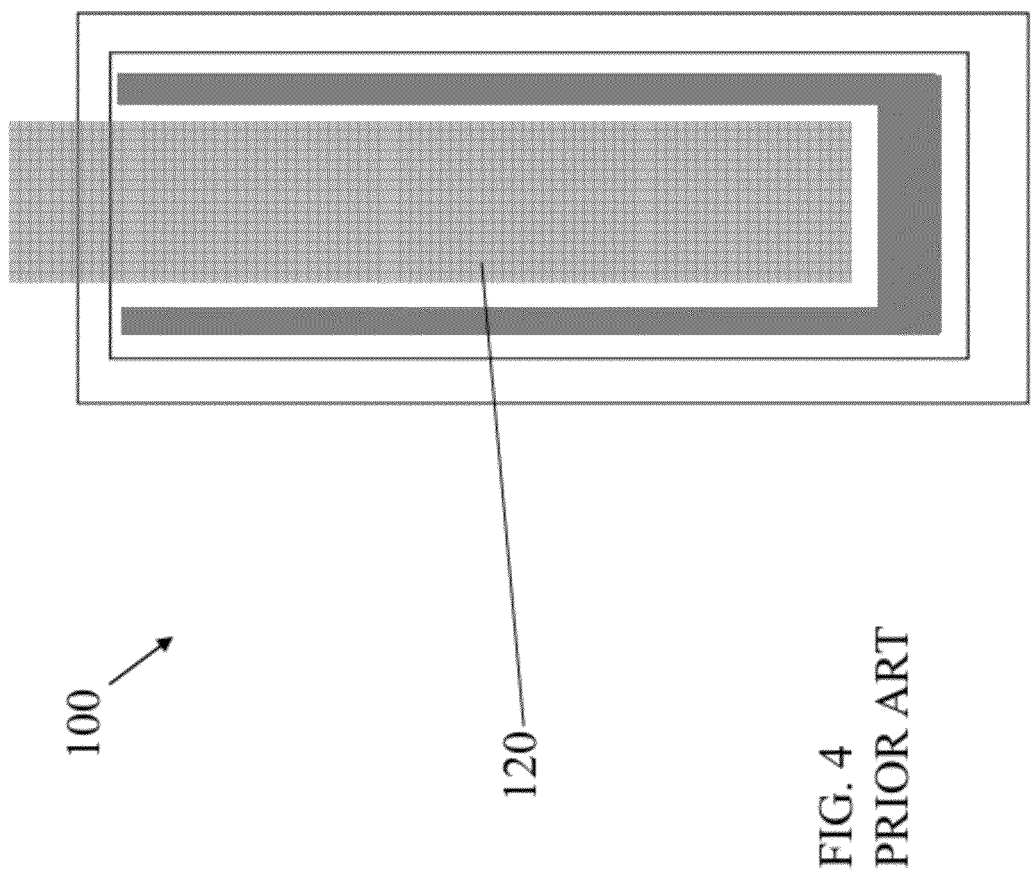
Figure 5:
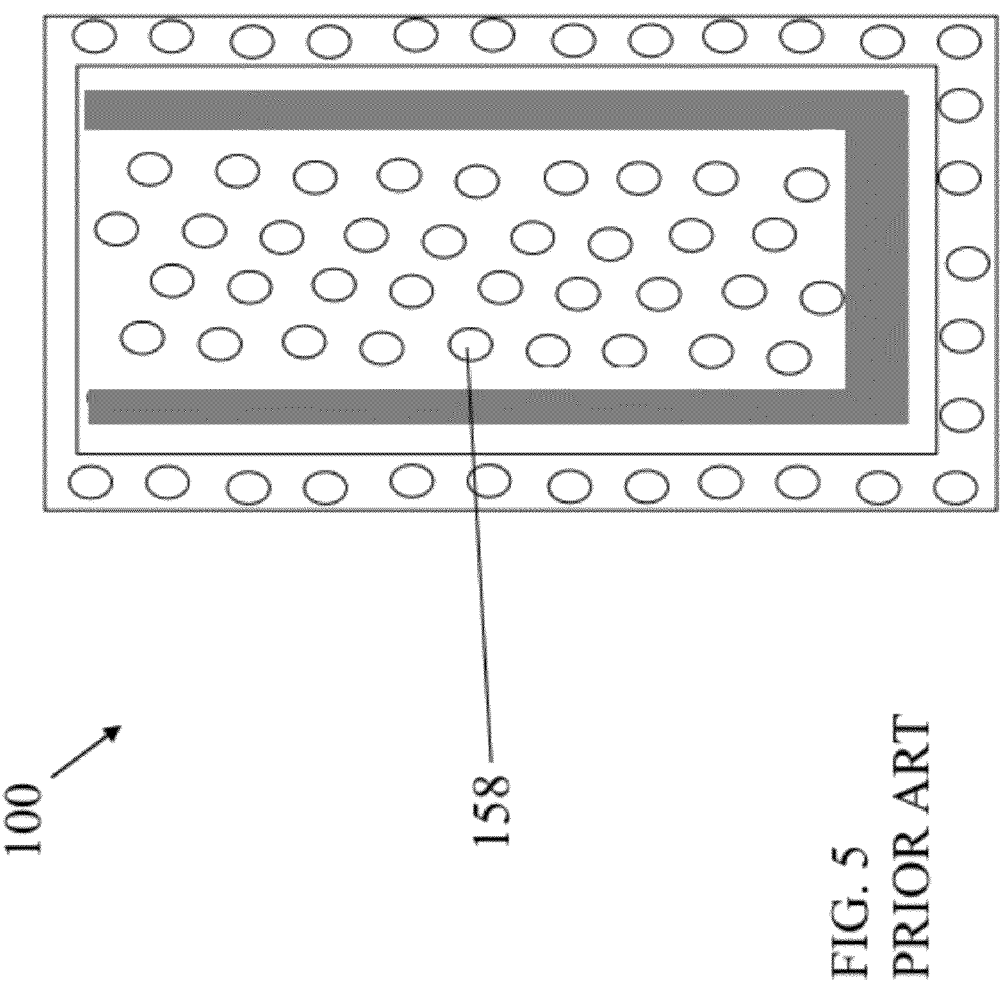

Turning now to FIGS. 2-4, for illustrative purposes, other top views of prior art semiconductor structure 100 are shown. FIG. 2 shows a top view of semiconductor structure 100 above electrode 170. FIG. 3 shows a top view of semiconductor structure 100 above beam 120. FIG. 4 shows a top view of semiconductor structure 100 above vent opening 158.

Figure 6:
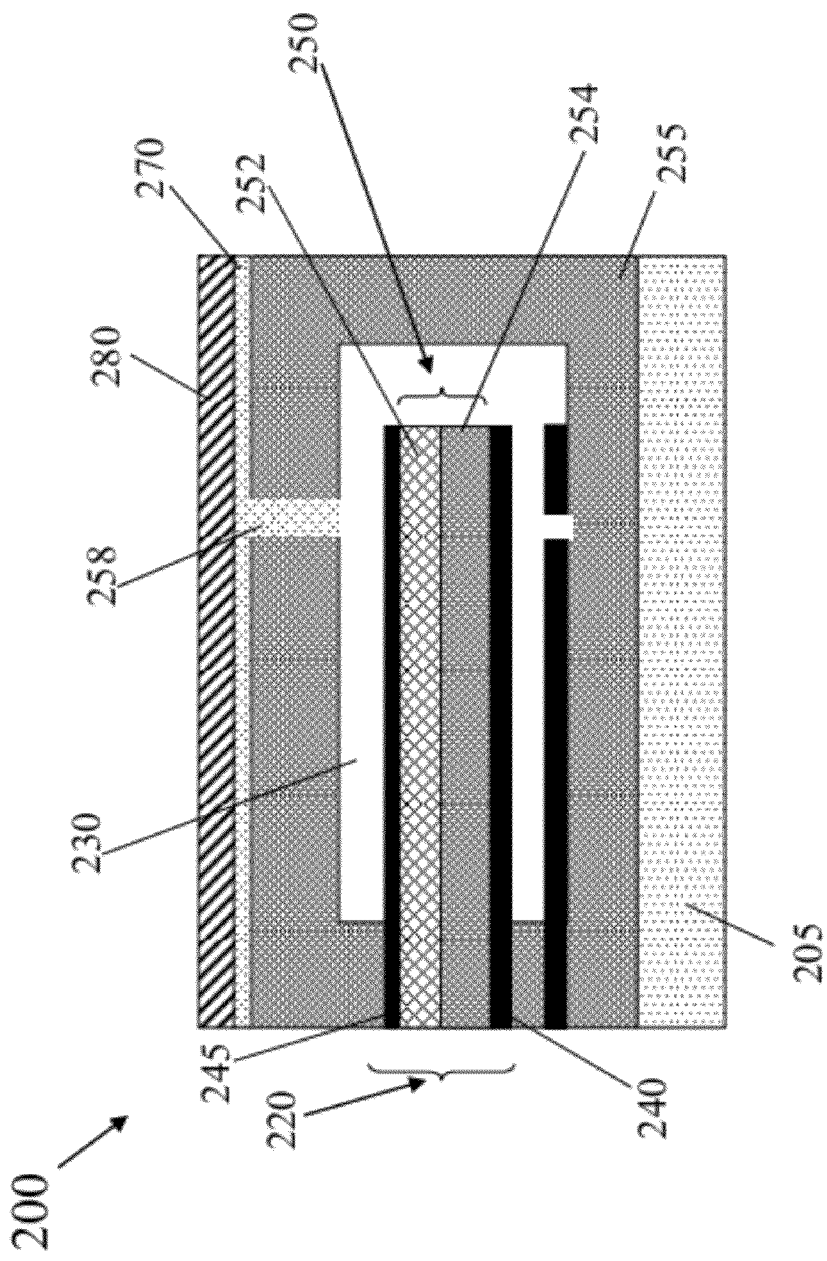
FIG. 6 shows a cross-sectional view of a semiconductor structure according to an embodiment of the invention.

Turning now to FIG. 6, a cross-sectional view of a semiconductor structure 200 according to an embodiment of the invention is shown. In this embodiment, beam 220 may include an insulator layer 250. Insulator layer 250 may include an upper insulator layer 252 and a lower insulator layer 254. Upper insulator layer 252 and lower insulator layer 254 may include, for example, silicon dioxide. As used herein, insulator layer 250, upper insulator layer 252, and lower insulator layer 254 may also be referred to as oxide layer 250, upper oxide layer 252, and lower oxide layer 254, for exemplary purposes only. It is understood that insulator layer 250, upper insulator layer 252, and lower insulator layer 254 may include any other insulators, besides silicon dioxide, as known in the art. Although upper oxide layer 252 and lower oxide layer 254 are shown in FIG. 6 as a single film, it is understood that upper oxide layer 252 may include one or more layers and lower oxide layer 254 may include one or more layers.

Figure 7:
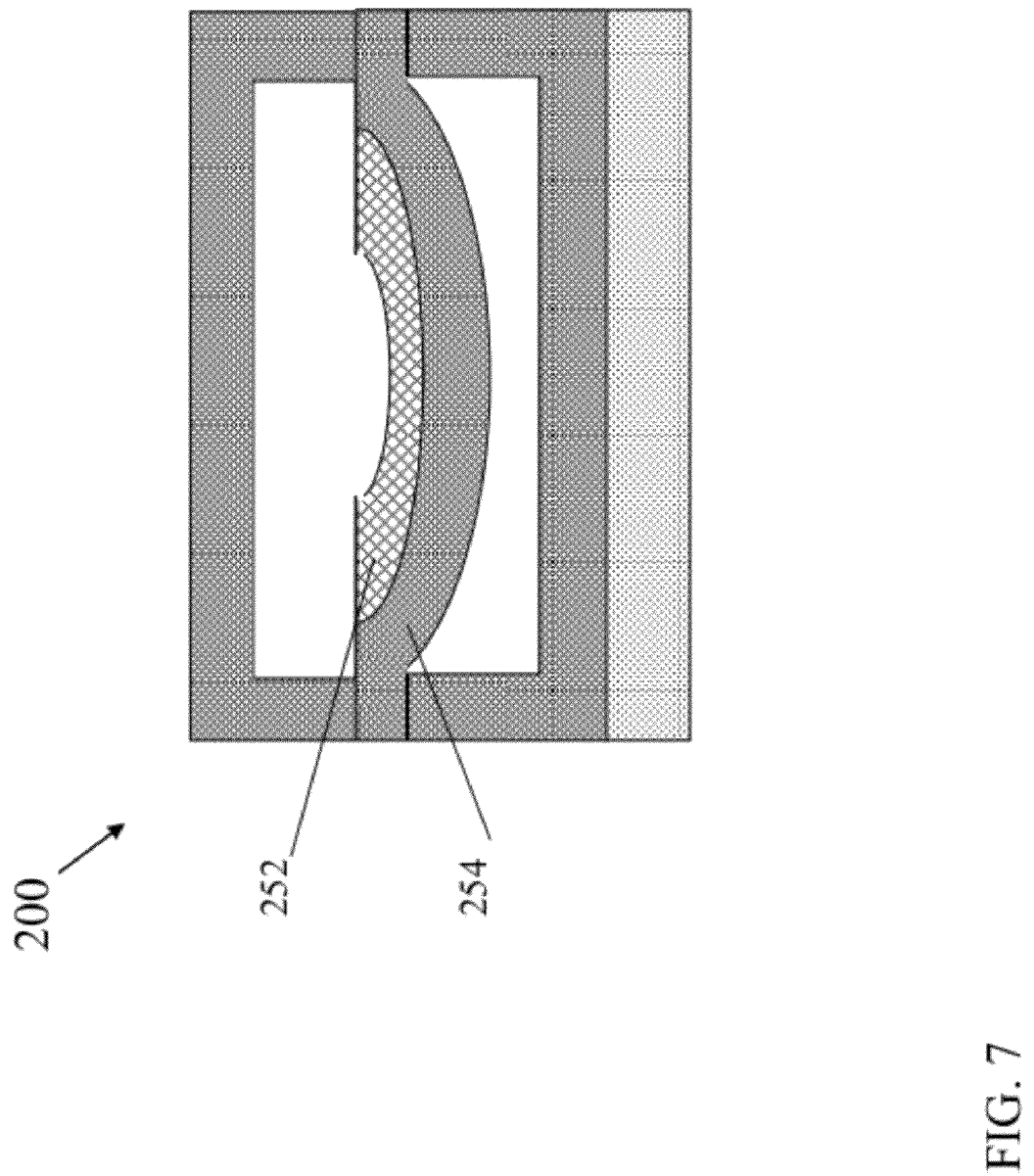
FIGS. 7 and 8 show cross-sectional views of a beam of the semiconductor structure according to embodiments of the invention under different stress gradients.

Upper oxide layer 252 may include a composite stress that is different than a composite stress of lower oxide layer 254. That is, there is a vertical stress gradient within oxide layer 250. In one embodiment, if upper oxide layer 252 and lower oxide layer 254 are tensiley stressed, the composite stress of upper oxide layer 252 may be more tensile than the composite stress of lower oxide layer 254, i.e., upper oxide layer 252 has a higher tensile stress. If upper oxide layer 252 and lower oxide layer 254 are compressively stressed, the composite stress of upper oxide layer 252 may be less compressive than the composite stress of lower insulator layer 254, i.e., upper oxide layer 252 has a lower compressive stress. In these embodiments, beam 220 will bend in a downward position, as shown in FIG. 7. Note that in FIG. 7, only upper oxide layer 252 and lower oxide layer 254 are shown and other portions of semiconductor structure 200 have been omitted for clarity purposes.

Figure 8:
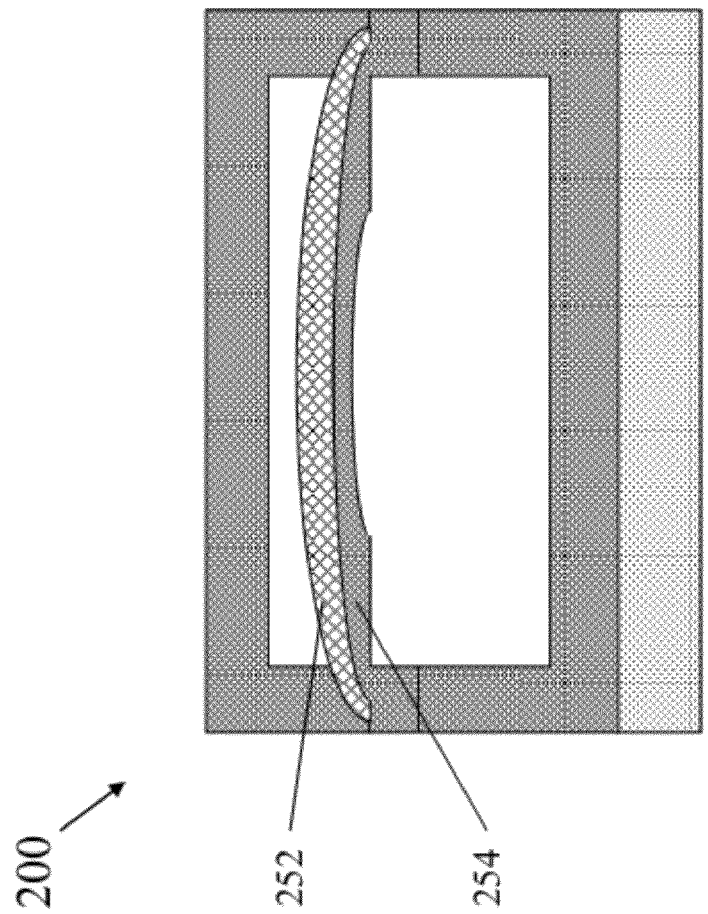

In another embodiment, if upper oxide layer 252 and lower oxide layer 254 are tensiley stressed, the composite stress of lower oxide layer 254 may be more tensile than the composite stress of upper insulator layer 252, i.e., lower oxide layer 254 has a higher tensile stress. If lower oxide layer 254 and upper oxide layer 252 are compressively stressed, the composite stress of lower oxide layer 254 may be less compressive than the composite stress of upper insulator layer 252, i.e., lower oxide layer 254 has a lower compressive stress. In these embodiments, beam 220 will bend in an upward position, as shown in FIG. 8. Note that in FIG. 8, only upper oxide layer 252 and lower oxide layer 254 are shown and other portions of semiconductor structure 200 have been omitted for clarity purposes.

In either embodiment, the vertical stress gradient (i.e., upper oxide layer 252 is stressed differently from lower oxide layer 254) across oxide layer 250 will provide control of the bending of beam 220. Note that, for example, if the beam 220 is not flat without putting a stress gradient into oxide layer 250, then the vertical gradient described above will cause the released beam 220 to bend up, i.e., a released beam 220 with stress and without a stress gradient in oxide layer 250 could have a positive/upwards bending. By putting a stress gradient such that the composite stress of upper oxide layer 252 is different than the composite stress of lower oxide layer 254 could cause the beam to flatten out with no positive or negative bending.

FIG. 6 illustrates other layers that may be included in semiconductor structure 200. Semiconductor structure 200 may include a lower conductor layer 240 below oxide layer 250 and an upper conductor layer 245 above oxide layer 250. Although lower conductor layer 240 and upper conductor layer 245 are shown in FIG. 6 as single films, lower conductor layer 240 and upper conductor layer 245 may include one or more metal layers.

Lower conductor layer 240 and upper conductor layer 245 may include the same or different materials. Lower conductor layer 240 and upper conductor layer 245 may extend both inside and outside of cavity 230. Lower conductor layer 240 and upper conductor layer 245 may include TiN/AlCu/TiN, TiAl3/AlCu/TiAl3, or similar composites as known in the art. However, lower conductor layer 240 and upper conductor layer 245 may also include any conductor or semiconductor including Au, Pt, Ru, Ir, W, TiN, Si, Ge, etc.

Other layers in semiconductor structure 200 shown in FIG. 6 may include a substrate 205 and a second oxide layer 255. Second oxide layer 255 may be under and substantially surrounding sealed cavity 230. Second oxide layer may include wires, vias, active devices, such as transistors, passive devices, such as inductors, etc. Second oxide layer 255 may include $SiO_2$, or any other materials as known in the art. Semiconductor structure 200 may include an electrode 207 and a dielectric layer 270 above second oxide layer 155. Second oxide layer 255 may include at least one venting opening 258 and dielectric layer 270 may be within at least one venting opening 258. Semiconductor structure 200 may also include a sealing layer 280 above dielectric layer 270 for preventing moisture from entering semiconductor structure 100 at elevated temperatures or pressures, such as silicon nitride. Sealing layer 280 may be hermetic.

Figure 9:
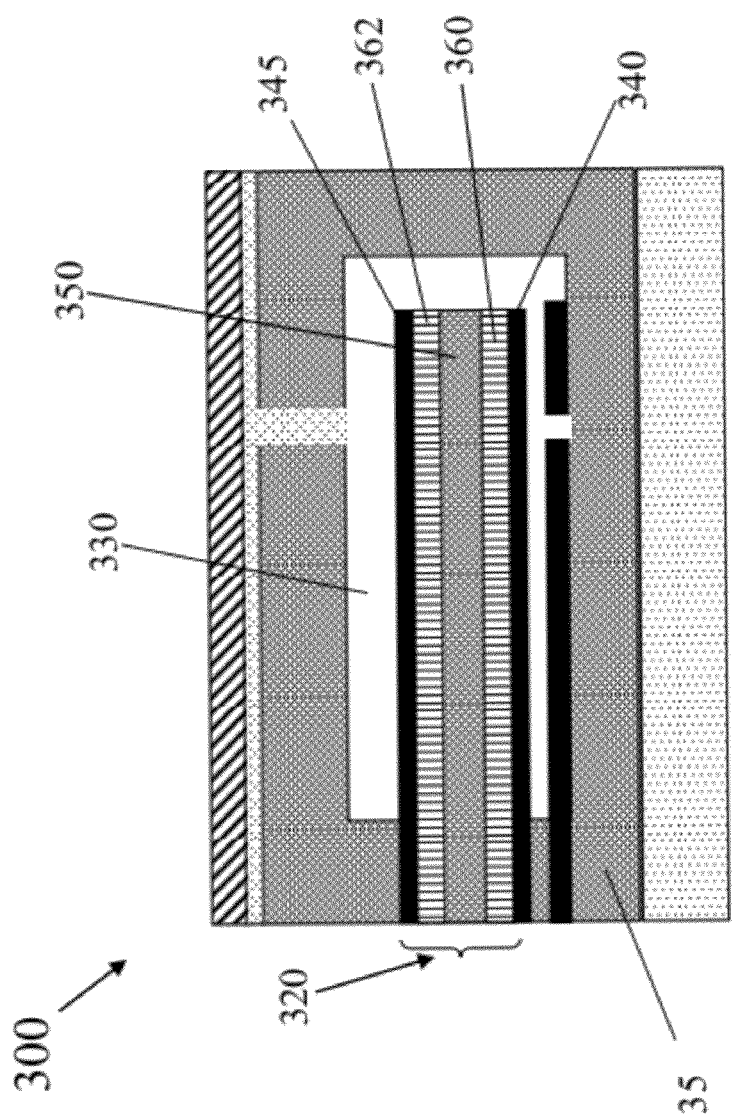
FIG. 9 shows a cross-sectional view of a semiconductor structure according to an embodiment of the invention.

Turning now to FIG. 9, a semiconductor structure 300 according to an embodiment of the invention is shown. Semiconductor structure 300 may include beam 320 within sealed cavity 330. Beam 320 may include oxide layer 350. Oxide layer 350 may include any now known or later developed insulator material, such as, but not limited to silicon dioxide.

Semiconductor structure 300 in FIG. 9 may include features of semiconductor structure 200, as discussed with respect to FIG. 6. That is, semiconductor structure 300 may include a lower conductor layer 340 and an upper conductor layer 345. Oxide layer 350 may be between lower conductor layer 340 and upper conductor layer 345. Lower conductor layer 340 and upper conductor layer 345 may include one or more metal layers. Lower conductor layer 340 and upper conductor layer 345 may include the same or different materials. Lower conductor layer 340 and upper conductor layer 345 may extend both inside and outside of cavity 330. Lower conductor layer 340 and upper conductor layer 245 may include TiN/AlCu/TiN, TiAl3/AlCu/TiAl3, or similar composites as known in the art. However, lower conductor layer 240 and upper conductor layer 245 may also include any conductor or semiconductor including Au, Pt, Ru, Ir, W, TiN, Si, Ge, etc.

Oxide layer 350 may include a tensiley stressed insulator material, such as silicon dioxide ($SiO_2$). One advantage of this beam design, using $SiO_2$ for oxide layer 350 at center of beam 320 and metals cladding the oxide layer 350 below and above is that $SiO_2$ has a CTE similar to that of the surrounding dielectric and silicon substrate. Any material with a low CTE could be used for the oxide layer 350 at center of beam 320, such as, silicon, silicon dioxide, silicon carbide, etc. Oxide layer 350 may include an unstable stress when exposed to humid ambient air, due to water absorption through the exposed surface of oxide layer 350. If oxide layer 350 is deposited using PECVD from a TEOS/oxygen plasma at low temperatures (i.e., approximately 400° C. or lower) and is tensiley stressed (ranging from 0 to 300 MPa), oxide layer 350 may be unstable and may absorb moisture, becoming less tensile over time with a stress gradient. This is because the moisture absorption is greater on the film surface of oxide layer 350. Alternatively, if oxide layer 350 is deposited using PECVD from a silane/$N_2$O plasma, at low temperatures (i.e., approximately 400° C. or lower), oxide layer 350 also can have stress which is unstable over time, due to water absorption through the surface of the film, and become more compressive with a stress gradient over time. Therefore, the unstable stress of oxide layer 350 may cause beam 320 to bend undesirably.

Therefore, as seen in FIG. 9, semiconductor structure 300 may include a first stabilizing insulator layer 360 and a second stabilizing insulator layer 362. First stabilizing insulator layer 360 may be below oxide layer 350 and second stabilizing insulator layer 362 may be above oxide layer 350. First and second stabilizing insulator layers 360, 362 may cover all surfaces of oxide layer 350. Although first stabilizing insulator layer 360 and second stabilizing insulator layer 362 are shown including a single film, it is understood that first stabilizing insulator layer 360 and second stabilizing insulator layer 362 may include one or more layers. Oxide layer 350 may also include one or more layers. First stabilizing insulator layer 360 and second stabilizing insulator layer 362 may include any now known or later developed insulator material, such as, but not limited to, silicon dioxide.

Oxide layer 350 may include an unstable stress when exposed to ambient. Due to this unstable stress, oxide layer 350 may undesirably bend in an upward or downward position. First stabilizing insulator layer 360 and second stabilizing insulator layer 362 may include a stable stress when exposed to ambient. For example, oxide layer 350 may include an unstable tensile stress and first and second stabilizing insulator layers 360, 362 may include a stable compressive stress. Therefore, a vertical stress gradient may be across first stabilizing insulator layer 360, oxide layer 350, and second stabilizing insulator layer 362. First stabilizing insulator layer 360 and second stabilizing insulator layer 362 may ensure that beam 320 does not undesirably bend due to the bending of oxide layer 350. First stabilizing insulator layer 360 and second stabilizing insulator layer 362 may each be at least approximately fifty nanometers thick, which may be thick enough to prevent oxide layer 350 to undesirably bend.

Figure 10:
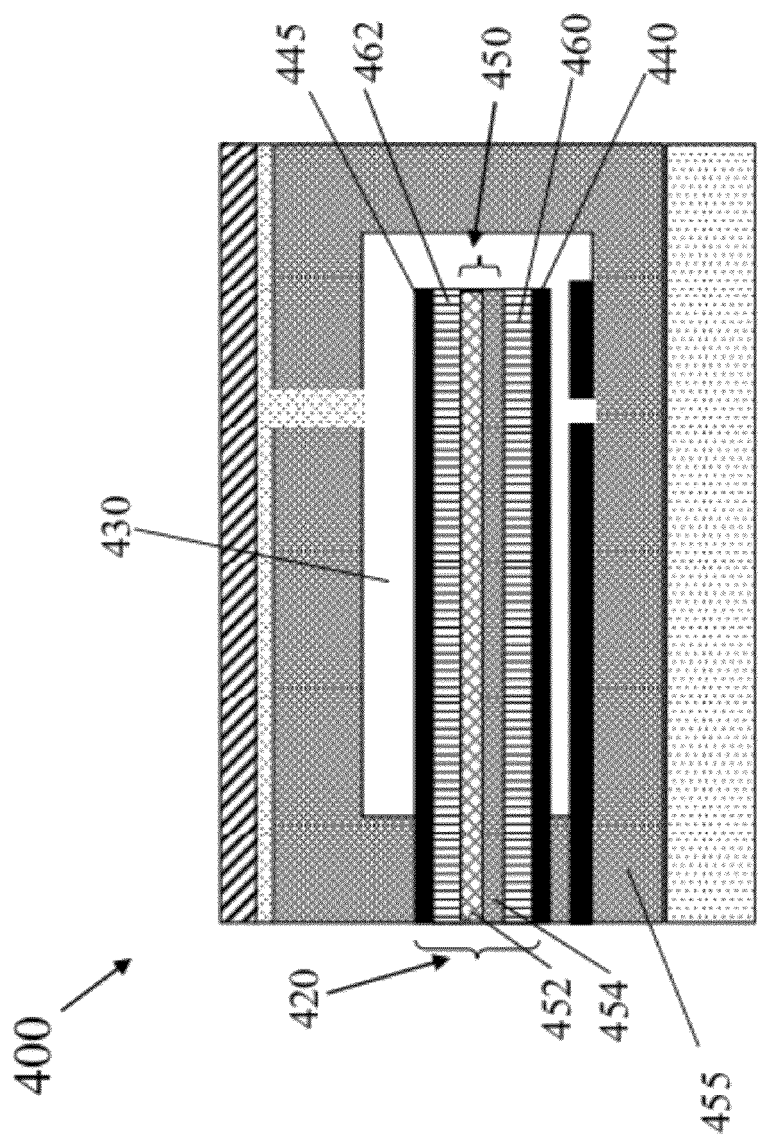
FIG. 10 shows a cross-sectional view of a semiconductor structure according to an embodiment of the invention.

Turning now to FIG. 10, a semiconductor structure 400 according to an embodiment of the invention is shown. Semiconductor structure 400 may include beam 420 within sealed cavity 430. Beam 420 may include oxide layer 450 that includes all features of oxide layer 250 (FIG. 6). That is, oxide layer 450 may include upper oxide layer 452 and lower oxide layer 454. As mentioned above with respect to FIG. 6, upper oxide layer 452 may include a composite stress that is different from a composite stress lower oxide layer 454. That is, there is a vertical stress gradient within oxide layer 450 in order to control beam 420 to bend in a downward position (FIG. 7) or an upward position (FIG. 8).

Beam 420 may further include at least one of: first stabilizing insulator layer 460 and/or second stabilizing insulator layer 462, which are discussed above with respect to FIG. 9. If lower insulator layer 454 includes an unstable stress when exposed to ambient, beam 420 may include first stabilizing insulator layer 460 which includes a stable stress when exposed to ambient. If upper insulator layer 452 includes an unstable stress when exposed to ambient, beam 420 may include second stabilizing insulator layer 462 which includes a stable stress when exposed to ambient. As mentioned above, first and second stabilizing insulator layers 460, 462 may include silicon dioxide and may each be at least approximately 50 nanometers thick. First and second stabilizing insulator layers 460, 462 may also both include a stable compressive stress.

Figure 11:
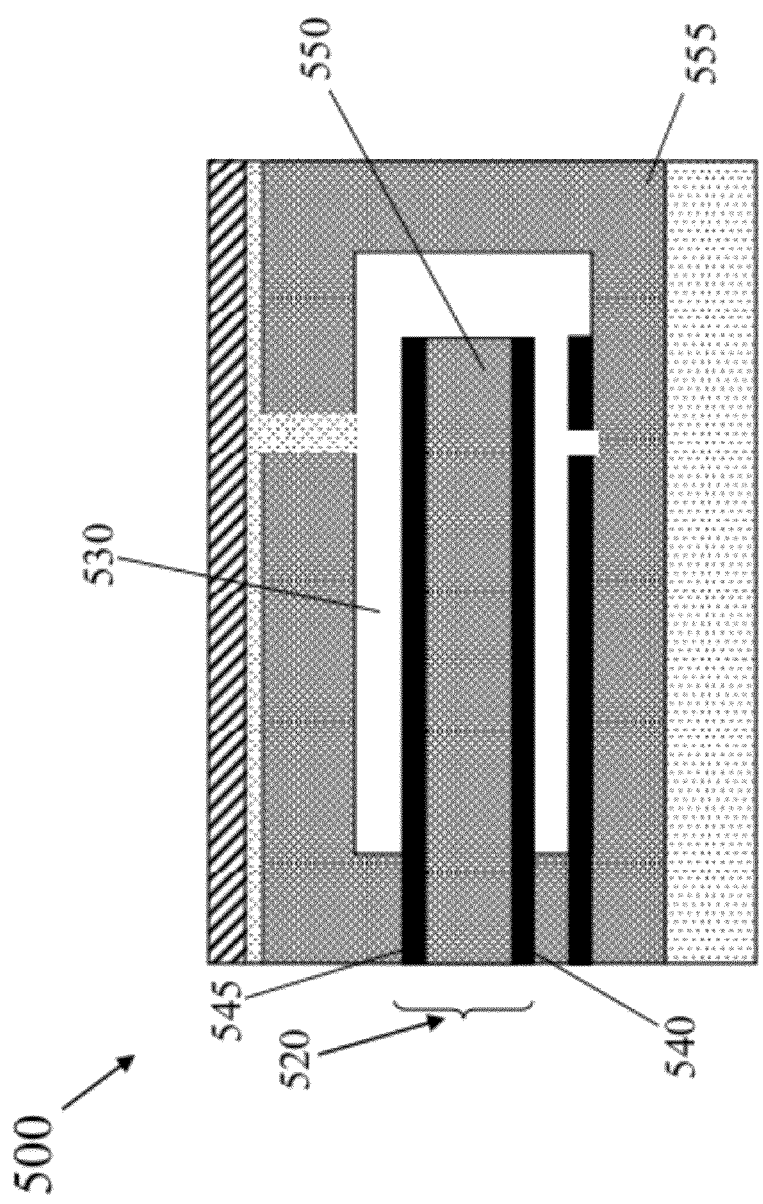
FIG. 11 shows a cross-sectional view of a semiconductor structure according to an embodiment of the invention.

Referring now to FIG. 11, a semiconductor structure 500 according to an embodiment of the invention is shown. Semiconductor structure 500 may include beam 520 within sealed cavity 530. Beam 520 may include a vertical gradient to control beam bending. Beam 520 may include oxide layer 550, as discussed above with previous embodiments. Beam 520 may also include lower conductor layer 540 and upper conductor layer 545. At least one of: a stress, a thickness, or a pattern factor of upper conductor layer 545 may be different than a stress, a thickness, or a pattern factor of lower conductor layer 540, such that there is a vertical gradient to control beam 520.

Using stress as an example, in one embodiment, where upper conductor layer 545 and lower conductor 540 are tensiley stressed, if the tensile stress of upper conductor 545 is greater than the tensile stress of lower conductor 540, i.e., upper conductor 545 has a higher tensile stress, beam 520 will bend down. In another embodiment, where upper conductor 545 and lower conductor 540 are compressively stressed, if the compressive stress of lower conductor 540 is greater than the compressive stress of upper conductor 545, i.e., lower conductor 540 has a higher compressive stress, beam 520 will bend upwards. In either embodiment, the vertical stress gradient (i.e., upper conductor 545 is stressed differently from lower conductor 540) will provide control of the bending of beam 520.

Lower conductor layer 540 and upper conductor layer 545 may each include include one or more metal layers. For example, lower conductor layer 540 and upper conductor layer 545 may include TiN/AlCu/TiN, TiAl3/AlCu/TiAl3, or similar composites as known in the art. However, lower conductor layer 540 and upper conductor layer 545 may also include any conductor or semiconductor including Au, Pt, Ru, Ir, W, TiN, Si, Ge, etc.

In one embodiment, upper conductor layer 545 and lower conductor layer 540 comprise Ti/TiAl3/AlCu/TiAl3/TiN wherein the AlCu in the middle includes a thickness that is much greater than the Ti/TiAl3 and TiAl3/TiN under and over the AlCu. For PVD films, Ti and Ti-based films usually have compressive stress and AlCu usually has tensile stress. Since the AlCu thickness is much greater than the combined Ti and Ti-based film thicknesses, the composite stress of conductor layer is tensile. To put a stress gradient using the lower conductor layer 540 and upper conductor layer 545 onto the beam to cause it to bend downwards, for example, the Ti and Ti-based film thicknesses could be the same for the lower conductor layer 540 and upper conductor layer 545 but upper conductor layer 545 may include a AlCu thickness is greater than the lower conductor layer 540 AlCu thickness, which would induce a downwards bending of the released MEMS beam 520. An upwards bending of the released MEMS beam may be induced by having the lower conductor layer 540 have thicker AlCu thickness than the upper conductor layer 545. In one exemplary embodiment causing the released MEMS beam 520 to bend downwards, the Ti/TiAl3 under thickness can be 10/30 nm; the TiAl3/TiN thickness over can be 30/32 nm, the lower conductor layer 540 AlCu thickness can be 400 nm; and the upper conductor layer 545 AlCu thickness can be 440 nm. The discussion above assumes that the lower conductor layer 540 and upper conductor layer 545 have identical layouts. If the layout of one of the conductor layers 540, 545 has a lower pattern factor than the other, then the stress of that conductor layer 540, 545 would have less effect on beam bending. For example, in the released MEMS beam 520, if lower conductor layer 540 and upper conductor layer 545 included identical layer thickness, the lower conductor layer 540 included a pattern factor of 70%, and the upper conductor layer 545 included a pattern factor of 75%, then upper conductor layer 545 can have a higher or more tensile stress than lower conductor layer 540. This may result in downwards bending of the released MEMS beam 520. The combined pattern factor and stress of conductor layers 540, 545 and insulator 550 needs to be taken into account when determining the released MEMS beam 520 bending.

Figure 12:
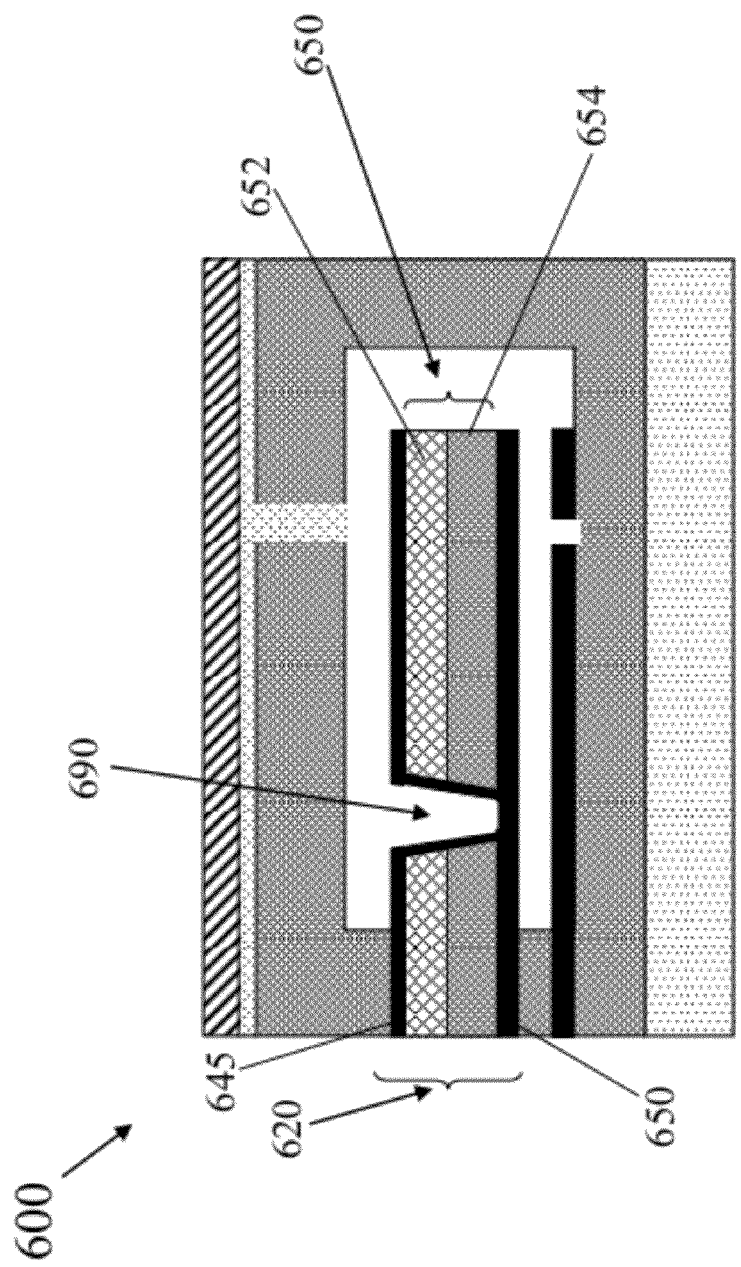
FIG. 12 shows a cross-sectional view of a semiconductor structure according to an embodiment of the invention.

Turning now to FIG. 12, a semiconductor structure 600 according to an embodiment of the invention is shown. Semiconductor structure 600 is similar to semiconductor structure 200 (FIG. 6). However, semiconductor structure 600 may include a conductive via 690. Conductive via 690 may be through oxide layer 650. Conductive via 690 may electrically connect upper conductor layer 645 and lower conductor layer 640 to reduce beam 620 resistance and improve beam 620 quality factor.

Turning now to the remaining figures, FIGS. 13-20 show cross-sectional views of a method of forming semiconductor structure 200.

As used herein, oxide depositing (i.e., oxide layer 250, 350, 450, 550, 650) can be deposited, for example, using a low temperature plasma enhanced chemical vapor deposition (PECVD) process. The temperature of deposition can be kept to 400° C. or less, so that the crystal structure of the copper- or aluminum based wiring is not degraded, as known in the art. Alternatively, if refractory metals are used in the MEMS beam, such as tungsten, then higher deposition temperatures could be employed, as known in the art. One example of a PECVD oxide film is deposited using TEOS as a silicon source and oxygen as an oxidizer. For this TEOS-based PECVD process, the film can be made more compressive by either increasing the RF power or decreasing the TEOS flow; and more tensile by either decreasing the RF power or increasing the TEOS flow. Another example of a PECVD oxide film is deposited using silane as a silicon source and oxygen or nitrous oxide (N2O) as an oxidizer. For this silane-based PECVD process, the film can be made more compressive by increasing the RF power; and more tensile by decreasing the RF power. Other dielectric films could be used for the beam, such as silicon nitride, alumina, etc.; and other deposition methods, such as physical vapor deposition (PVD), sub-atmospheric CVD (SACVD), atmospheric pressure CVD (APCVD), atomic layer deposition (ALD), and the like can be used to deposit the dielectric in the MEMS beam.

Figure 13:
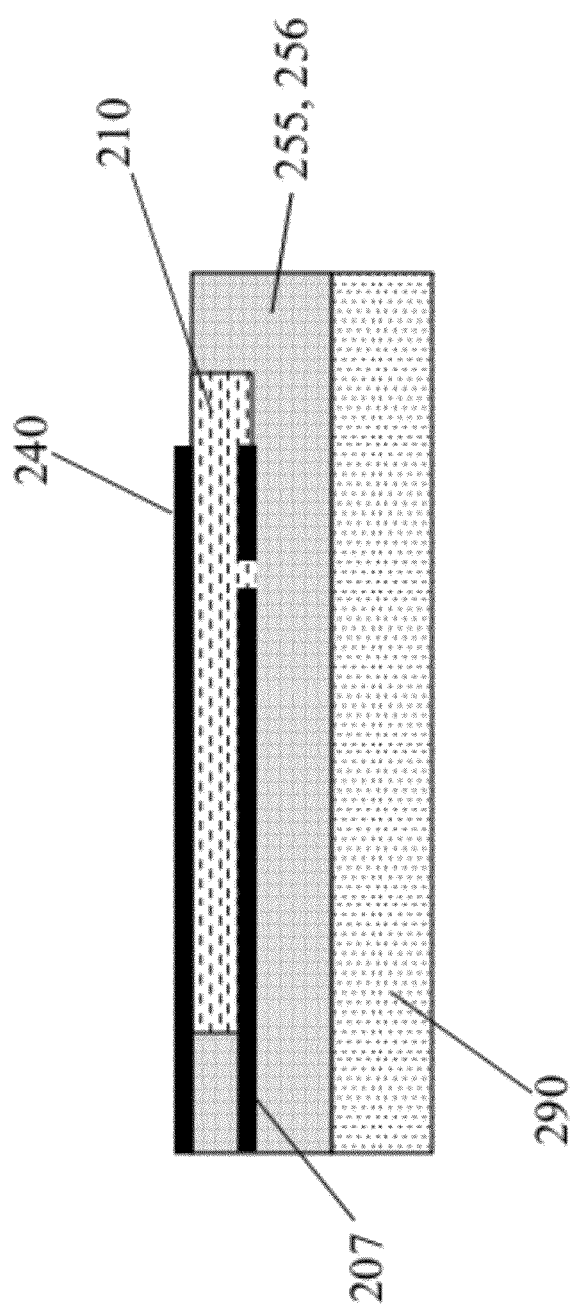
FIGS. 13, 14A-14D, 15, 16A-16B, and 17-20 show cross-sectional views of methods of forming a semiconductor structure according to embodiments of the invention.

Referring now to FIG. 13, a first sacrificial material layer 210 may be deposited and patterned over a substrate 205. Lower conductor 240 may be formed over first sacrificial material layer 210. First sacrificial material layer 210 may be deposited after a first portion 256 of second oxide layer 255 is deposited. Electrode 207 may be formed within a lower portion of first sacrificial material layer 210.

Figure 14A:
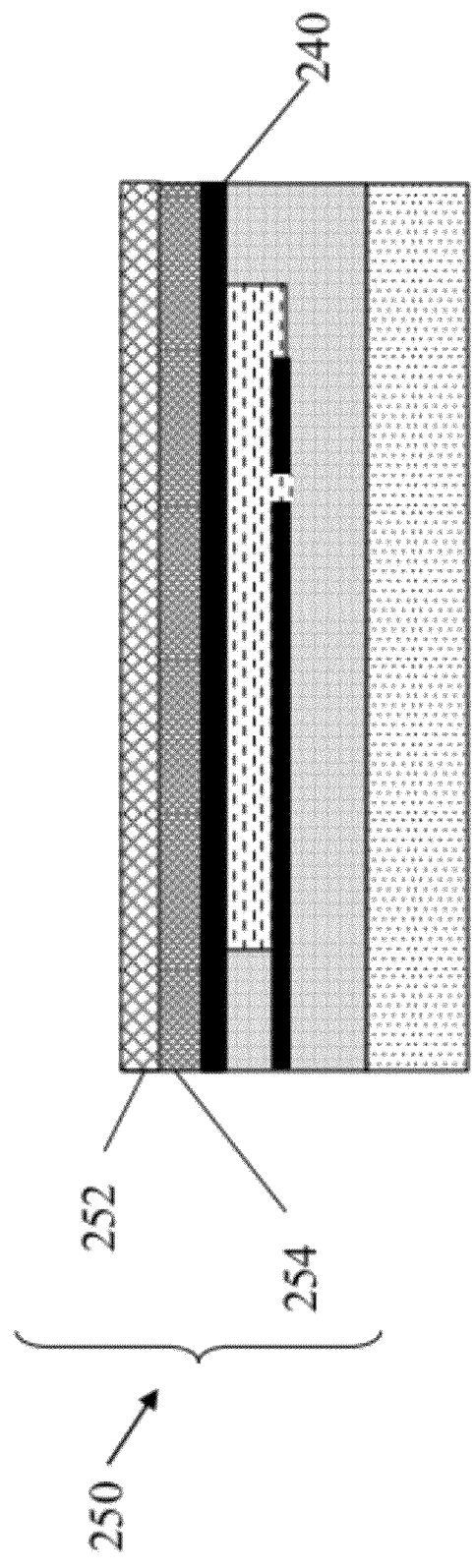
Figure 14B:
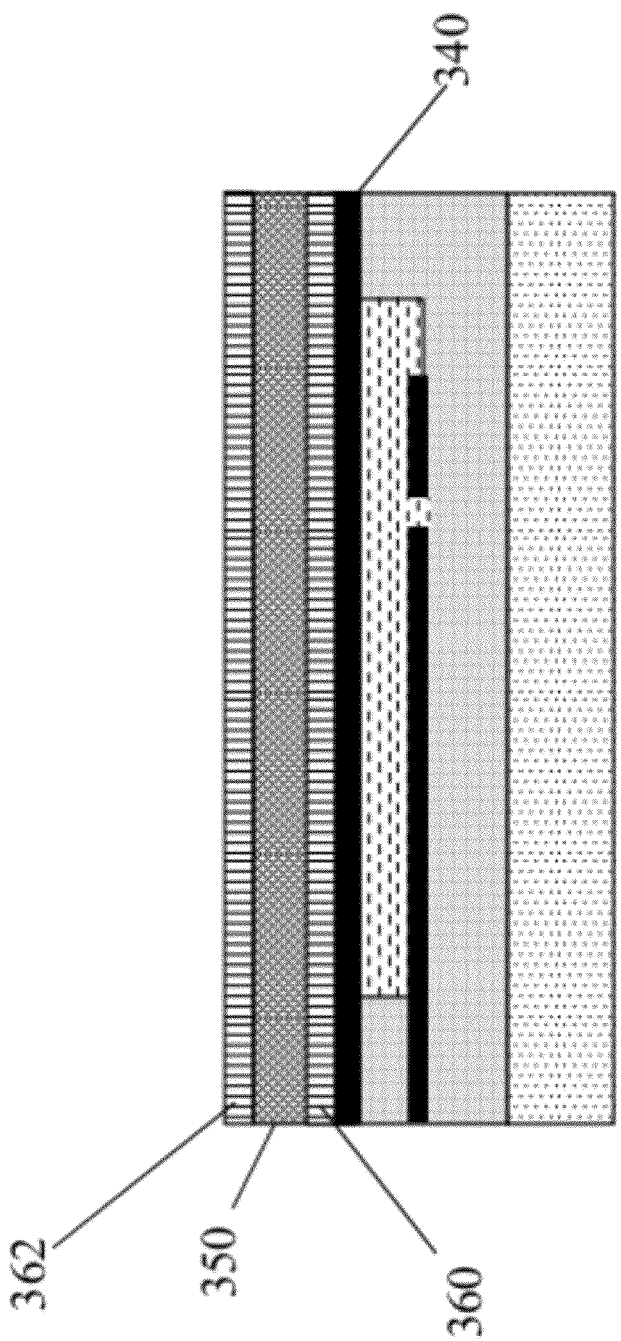
Figure 14C:
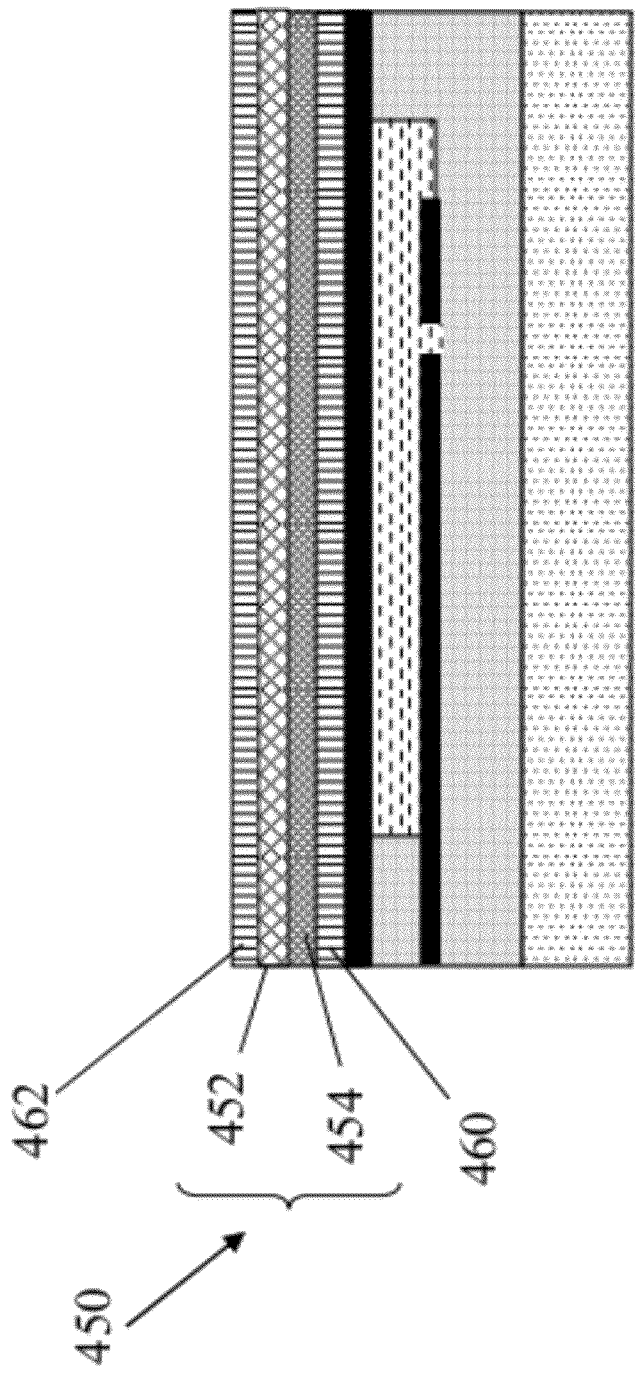

Turning now to FIG. 14A, in order to form semiconductor 200 of FIG. 6, oxide layer 250 may be deposited over lower conductor layer 240. Oxide layer 250 may include upper oxide layer 252 and lower oxide layer 254, as described above with respect to FIG. 6. A composite stress of upper oxide layer 252 may be different than a composite stress of lower oxide layer 254 in order to control beam 220 bending. In order to form semiconductor 300 of FIG. 9, first stabilizing insulator layer 360 is deposited over first conductor layer 240, prior to depositing oxide layer 350 (FIG. 14B). In order to form semiconductor 400 of FIG. 10, after depositing first stabilizing insulator layer 460 over first conductor layer 440, lower oxide layer 454 and upper oxide layer 452 are deposited, and then second stabilizing insulator layer 462 is deposited (FIG. 14C). First and second stabilizing insulator layers 460, 462 may be deposited above and/or below oxide layer 450, as discussed above. First and second stabilizing insulator layers 460, 462 may be at least approximately 50 nanometers thick and include a stable compressive stress, while upper oxide layer 452 and lower oxide layer 454 may include an unstable tensile stress when exposed to ambient humidity. In one exemplary embodiment, first and second stabilizing insulator layers 460, 462 may be 100 nanometers thick and oxide layer 450 may be approximately 1.6 microns thick.

Figure 14D:
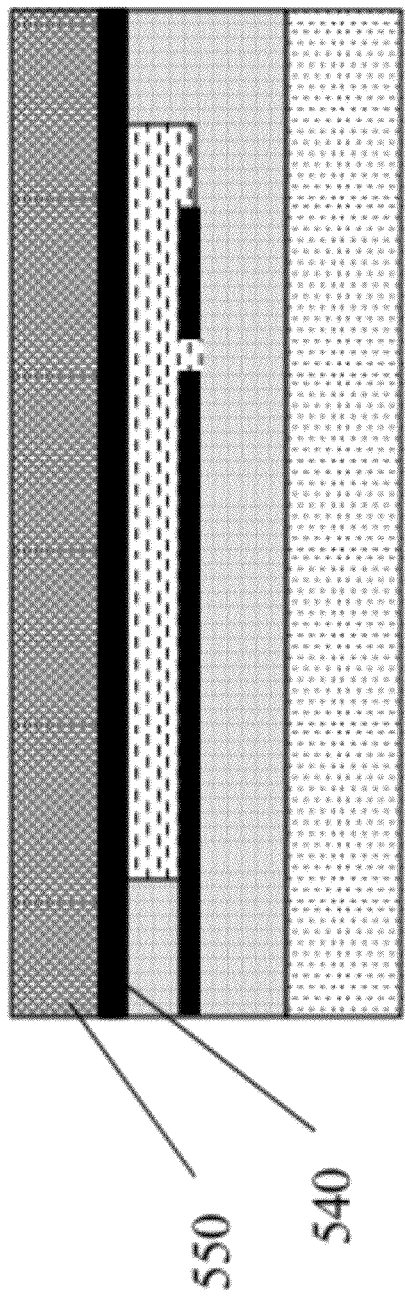

Turning now to FIG. 14D, in order to form semiconductor 500 of FIG. 11, first conductor layer 440 is deposited with at least one of: a stress, a thickness, or a pattern factor that is different than a stress, a thickness, or a pattern factor of upper conductor layer 545 that will be deposited over oxide layer 550, as discussed above with respect to FIG. 11.

Figure 15:
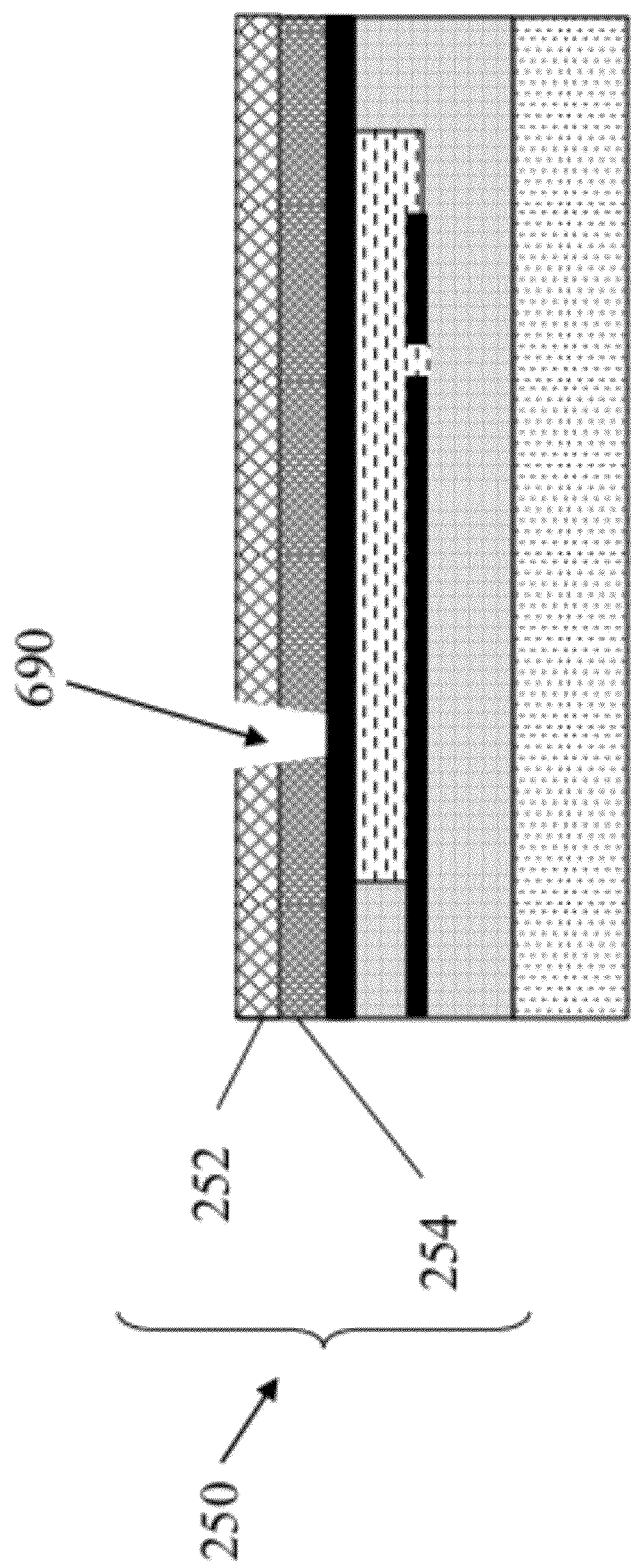

Returning now to FIG. 14A, oxide layer 250 may include a thickness greater than the thickness of lower conductor layer 240. A conductive via 690 may be formed within oxide layer 250 (through upper oxide layer 252 and lower oxide layer 254) to first conductor layer 240 (FIG. 15). Although conductive via 690 is only shown with semiconductor 200 of FIG. 6, it is understood that conductive via 690 may be formed with semiconductor 300 of FIG. 9, semiconductor 400 of FIG. 10, and semiconductor 500 of FIG. 11.

Figure 16A:
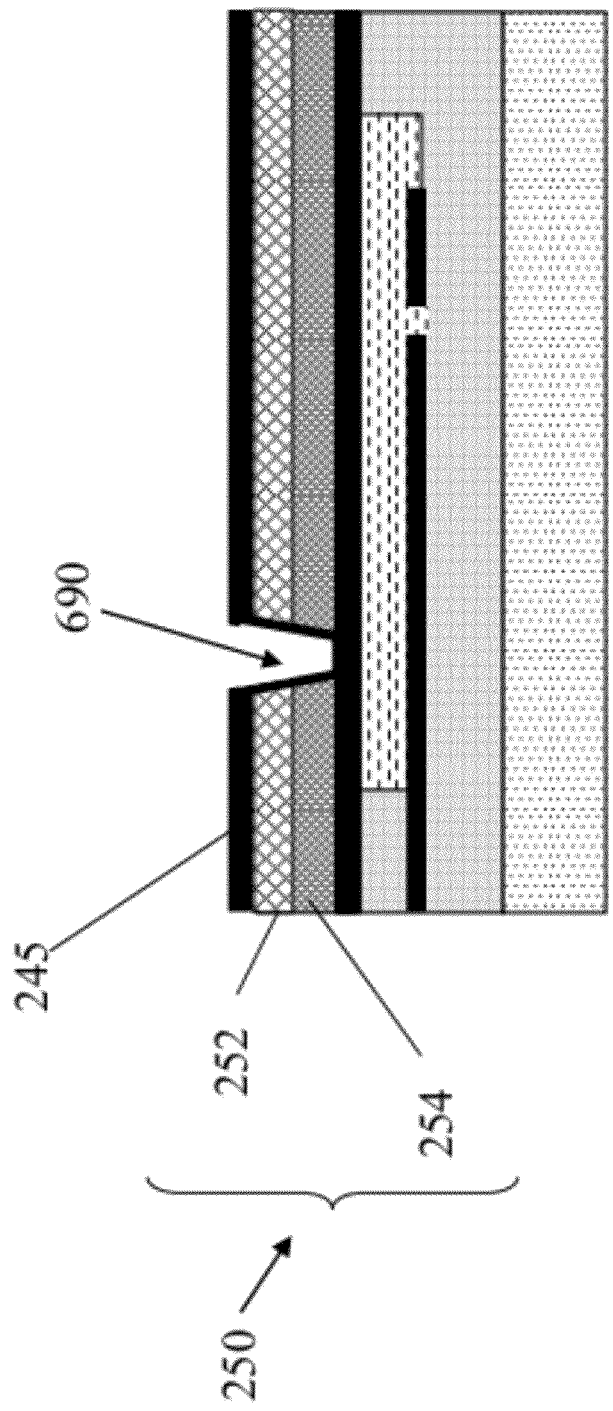

Upper conductor layer 245 and lower conductor layer 240 may be electrically connected by a via. A via may reduce the resistance of beam 220 and improve the quality factor of beam 220. However, if a via is formed using a prior art tungsten stud via process, then oxide layer 250 would need to be planarized, which would significantly increase the thickness variability. Increased oxide layer 250 thickness variability is undesirable because the released MEMS beam 220 would have increased spring constant variability. This would cause increased pull-in voltage variability. To eliminate this source of MEMS oxide layer 250 thickness variability, conductive via 690 can be formed between conductor layers 240 and 245. FIG. 15 shows that conductive via 690 may be patterned and etched into the upper and lower oxide layers 252, 254 immediately prior to upper conductor layer 245 deposition (FIG. 16A). If any of the oxide layers 252, 254 in beam 220 include an unstable stress when exposed to ambient, then upper conductive layer 245 deposition should include a heating step immediately prior to upper conductive layer 245 deposition to out gas any water in upper and lower oxide layers 252, 254. Then, upper conductor layer 245 may be patterned such that the unstable upper and lower oxide layers 252, 254 are completely covered by upper conductor layer 245. The heating step needs to be greater than 100° C. In one exemplary embodiment, the heated step would be between 150° C. to 350° C.

Figure 16B:
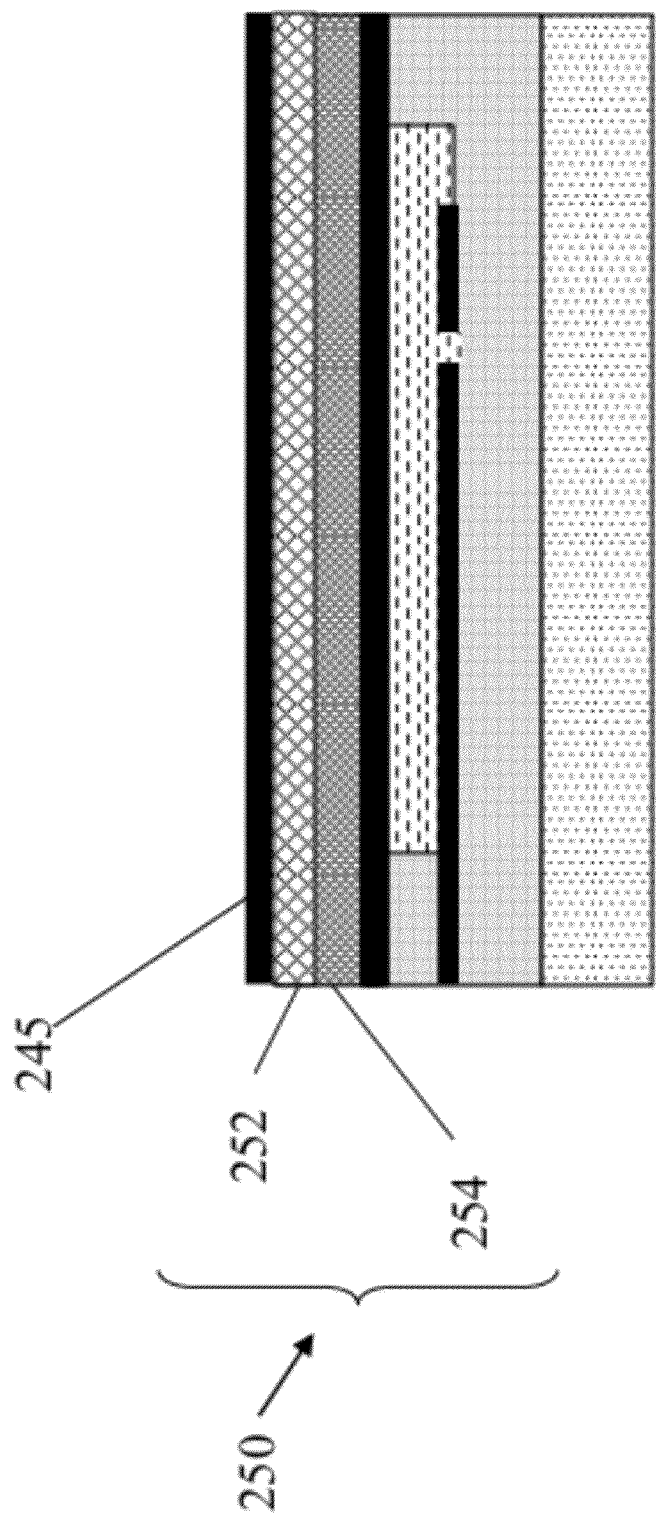
Figure 17:
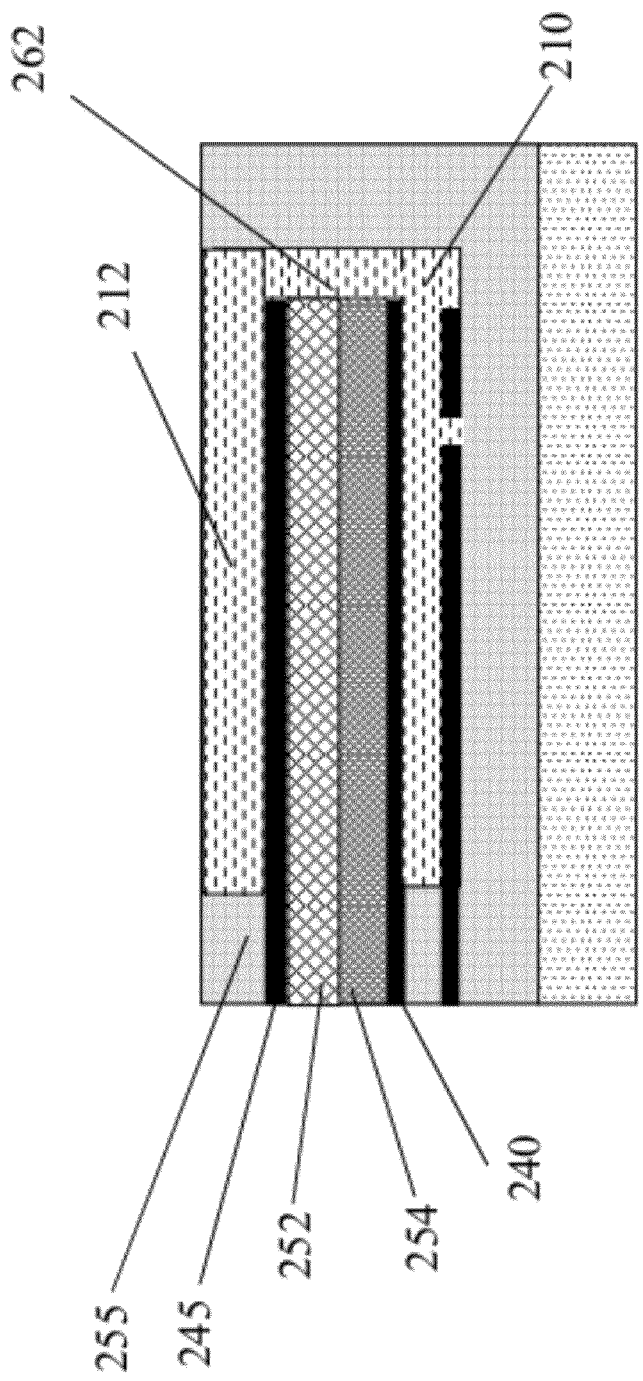
Figure 18:
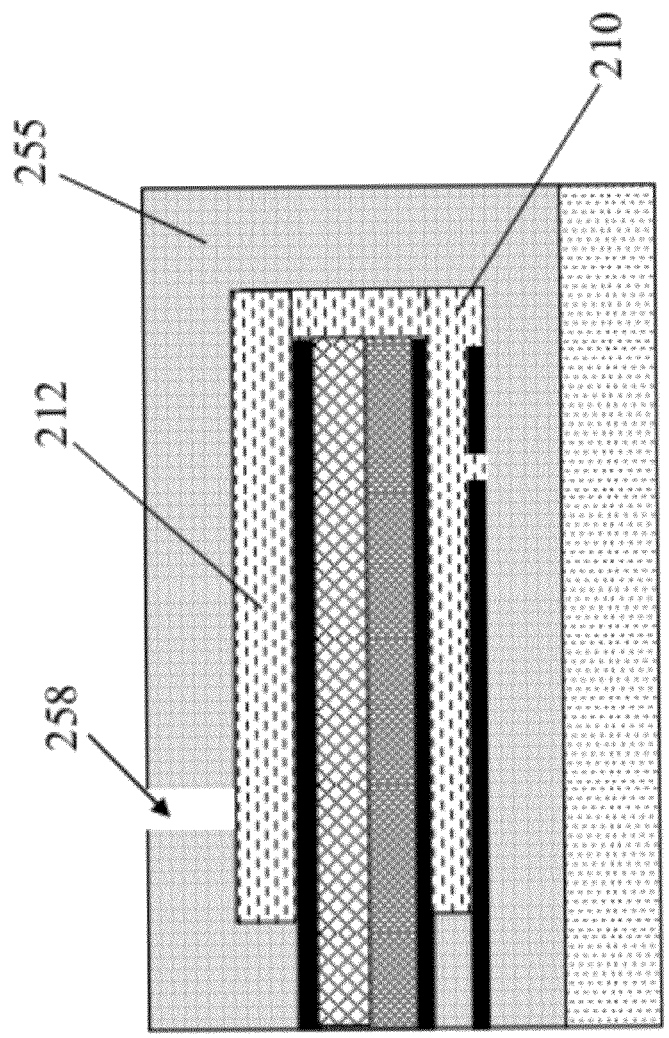
Figure 19:
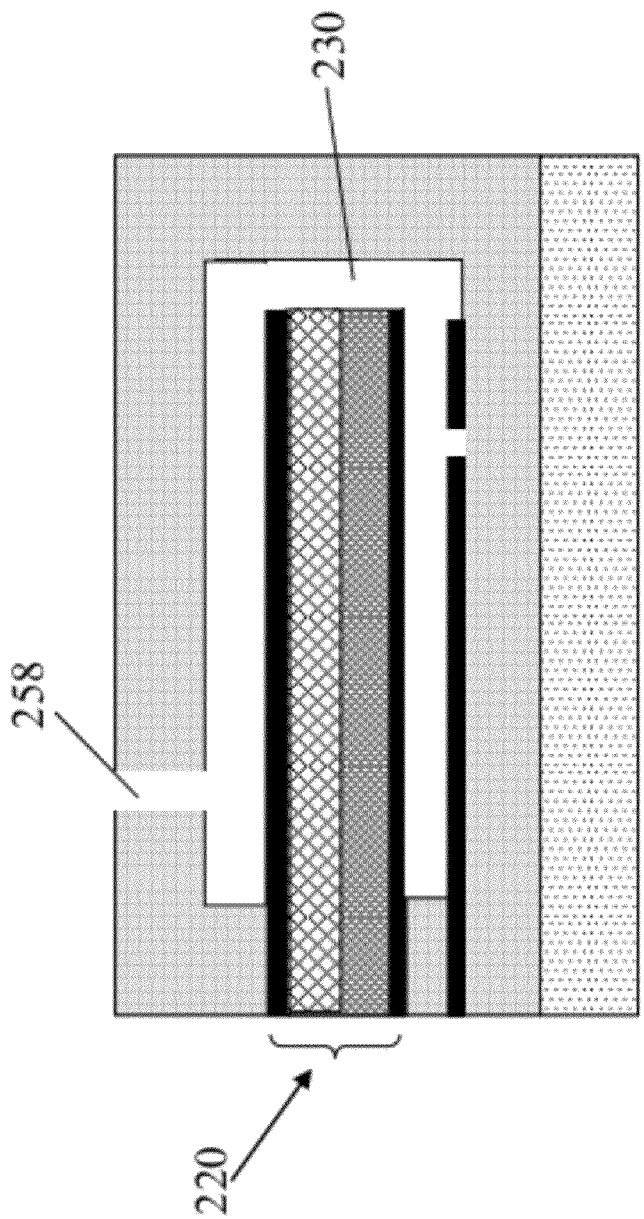

Turning now to FIG. 16B, and continuing with the embodiment shown in FIG. 14A (without conductive via 690), upper conductor layer 245 may be formed over upper oxide layer 245 of oxide layer 250. Turning now to FIG. 17, at least one cavity via 262 may be formed through lower conductor layer 240, upper oxide layer 252, lower oxide layer 254, and upper conductor 245 to first sacrificial material layer 210. Next, a second sacrificial material layer 212 may be deposited over upper conductor layer 245 and within second oxide layer 255. Second sacrificial material layer 212 may also be within at least one cavity via 262. At least one venting opening 258 may be formed through second oxide layer 255 to the top of second sacrificial material layer 212 (FIG. 18). Next, first and second sacrificial material layer 210, 212 may be "vented" through at least one venting opening 258 (FIG. 19). If the sacrificial materials are formed from silicon, then venting can be performed by, for example, flowing $XeF_2$ gas to etch away the silicon in the cavity. This forms cavity 230 around beam 220.

Figure 20:
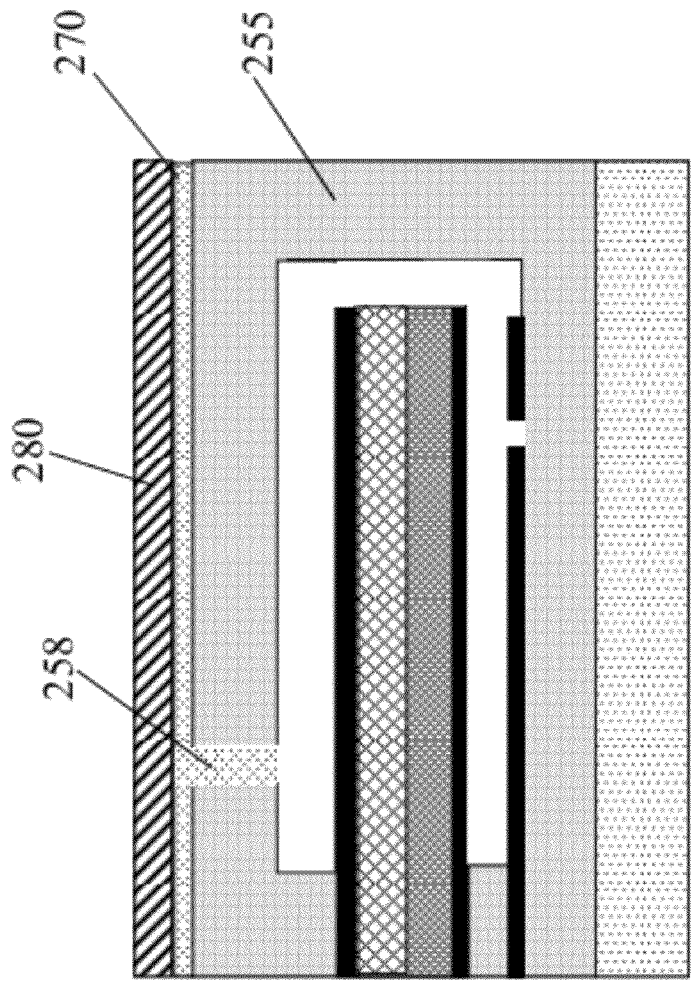

As shown in FIG. 20, dielectric layer 270 may be deposited above second oxide layer 255. Dielectric layer 270 may also be deposited within at least one venting opening 258. Sealing layer 280 may also be deposited above dielectric layer 270.

Sealing layer 280 may be hermetic. Subsequently, optional solder bumps may be fabricated and would be diced and packaged.

The foregoing drawings show some of the processing associated according to several embodiments of this disclosure. It should be noted that in some alternative implementations, the acts noted may occur out of the order noted or, for example, may in fact be executed substantially concurrently or in the reverse order, depending upon the act involved. Also, one of ordinary skill in the art will recognize that additional acts may be added.

The method as described above is used in the fabrication of MEMS devices and/or integrated circuit chips. The resulting devices and/or IC chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes MEMS and/or IC chips, ranging from cell phones, toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a beam within a sealed cavity, the method comprising:
   depositing a lower insulator layer comprising one or more layers;
   depositing an upper insulator layer over the first insulator layer, the upper insulator layer comprising one or more layers, wherein a composite stress of the upper insulator layer is different than a composite stress of the lower insulator layer;

forming a first conductor layer below the lower insulator layer and a second conductor layer above the upper insulator layer, wherein each conductor layer comprises one or more metal layers; and forming a stabilizing insulator layer between at least one of: the upper insulator layer and the second conductor or the first conductor and the lower insulator layer, wherein the at least one of the upper insulator layer or the lower insulator layer includes an unstable stress when exposed to ambient.

2. The method of claim 1, wherein the composite stress of the upper insulator layer is more tensile or less compressive than the composite stress of the lower insulator layer, such that the beam bends downward.

3. The method of claim 1, wherein the composite stress of the lower insulator layer is more tensile or less compressive than the composite stress of the upper insulator layer, such that the beam bends upward.

4. The method of claim 1, further comprising forming a conductive via through the upper insulator layer and the lower insulator layer, wherein the conductive via electrically connects the upper conductor layer and the lower conductor layer.

5. The method of claim 1, wherein the stabilizing insulator layer includes a stable compressive stress.

6. The method of claim 1, wherein the lower insulator layer, the upper insulator layer, and the stabilizing insulator layer include silicon dioxide.

7. The method of claim 1, wherein the stabilizing insulator layer is at least approximately 50 nanometers thick.

8. A method of forming a beam within a sealed cavity, the method comprising:
  depositing a first stabilizing insulator layer;
  depositing an insulator layer above the first stabilizing insulator layer, the insulator layer including an unstable stress when exposed to ambient; and
  depositing a second stabilizing insulator layer above the insulator layer, wherein the first stabilizing insulator layer and the second stabilizing insulator layer include a stable stress when exposed to ambient.

9. The method of claim 8, wherein at least one of: the first stabilizing insulator layer, the insulator layer, or the second stabilizing insulator layers include one or more layers.

10. The method of claim 8, further comprising forming a first conductor layer below the first stabilizing insulator layer and a second conductor layer above the second stabilizing insulator layer, wherein each conductor layer comprises one or more metal layers.

11. The method of claim 8, wherein the first stabilizing insulator layer and the second stabilizing insulator layer include a stable compressive stress.

12. The method of claim 8, wherein the first stabilizing insulator layer, the insulator layer, and the second stabilizing insulator layer include silicon dioxide.

13. The method of claim 8, wherein depositing the first stabilizing insulator layer and the second stabilizing insulator layer includes using a TEOS-based plasma enhanced chemical vapor deposition (PECVD) process.

14. The method of claim 8, wherein depositing the insulator layer includes using a silane-based plasma enhanced chemical vapor deposition (PECVD) process.

15. The method of claim 8, wherein the first stabilizing insulator layer and the second stabilizing insulator layer are at least approximately 50 nanometers thick.

16. The method of claim 10, further comprising forming a conductive via through the insulator layer, wherein the conductive via electrically connects the upper conductor layer and the lower conductor layer.

17. The method of claim 11, wherein the insulator layer includes an unstable tensile stress.

18. A method of forming a beam within a sealed cavity, the method comprising:
  forming a lower conductor layer comprising one or more metal layers;
  depositing an insulator layer above the lower conductor layer; and
  forming an upper conductor layer above the insulator layer, the upper conductor layer comprising one or more metal layers, wherein at least one of: a stress, a thickness, or a pattern factor of the upper conductor layer is different than a stress, a thickness, or a pattern factor of the lower conductor layer.

19. The method of claim 18, further comprising forming a conductive via through the insulator layer, wherein the conductive via electrically connects the upper conductor layer and the lower conductor layer.

20. The method of claim 18, wherein the stress of the upper conductor layer is more tensile or less compressive than the stress of the lower conductor layer, such that the beam bends downward.

21. The method of claim 18, wherein the stress of the upper conductor layer is less tensile or more compressive than the stress of the lower conductor layer, such that the beam bends upward.

22. The method of claim 18, wherein the insulator layer includes silicon dioxide.

\* \* \* \* \*